(12) United States Patent
Hung

(10) Patent No.: US 7,011,147 B1
(45) Date of Patent: Mar. 14, 2006

(54) HEAT PIPE TYPE CIRCULAR RADIATOR WITH SECTOR COOLING FINS

(76) Inventor: Chung-Tsai Hung, 5th Floor, No. 5, Alley 5, Lane 106, Ming Chuan Road, Lu Chou (TW) 247

( * ) Notice: Subject to any disclaimer, the term of this patent is extended or adjusted under 35 U.S.C. 154(b) by 0 days.

(21) Appl. No.: 10/989,328

(22) Filed: Nov. 17, 2004

(51) Int. Cl.
*F28F 7/00* (2006.01)

(52) U.S. Cl. ............................ 165/104.33; 165/104.26; 165/183; 165/80.3; 361/697; 361/704; 257/715

(58) Field of Classification Search .......... 165/104.33, 165/104.26, 104.21, 185, 80.4, 80.3; 361/697, 361/699, 700, 704; 257/714–715; 174/15.2
See application file for complete search history.

(56) References Cited

U.S. PATENT DOCUMENTS

| | | | |
|---|---|---|---|
| 2,620,171 A * | 12/1952 | Dubin et al. ................ | 165/182 |
| 6,167,619 B1 * | 1/2001 | Beagle ................... | 29/890.043 |
| 6,382,307 B1 * | 5/2002 | Wang et al. ................ | 165/80.3 |
| 6,487,076 B1 * | 11/2002 | Wang .......................... | 361/697 |
| 6,640,888 B1 * | 11/2003 | Horng et al. ............... | 165/185 |
| 6,749,011 B1 * | 6/2004 | Horng et al. .............. | 165/80.3 |
| 2003/0024687 A1 * | 2/2003 | Cheng et al. .............. | 165/80.3 |
| 2003/0094273 A1 * | 5/2003 | Toth et al. ................... | 165/183 |
| 2004/0182552 A1 * | 9/2004 | Kubo .................... | 165/104.33 |
| 2004/0190260 A1 * | 9/2004 | Sasaki ........................ | 361/704 |

\* cited by examiner

*Primary Examiner*—Terrell Mckinnon
(74) *Attorney, Agent, or Firm*—Troxell Law Office PLLC

(57) ABSTRACT

A heat pipe type circular radiator includes a plurality of sector cooling fins and a heat pipe. Each of the sector cooling fins has a main fin member with a through hole and has a big sector folded side and a small sector folded side at two lateral sides of the main fin member, respectively. The heat pipe passes through the sector cooling fins via the through hole respectively. Because the folded sides are designed has a shape of sector, the heat pipe with the cooling fins can be bent circularly and attached with a cooling base to form the circular radiator.

6 Claims, 7 Drawing Sheets

HEAT PIPE TYPE CIRCULAR RADIATOR WITH SECTOR COOLING FINS

BACKGROUND OF THE INVENTION

1. Field of the Invention

The present invention is related to a heat pipe type circular radiator and particularly to cooling fin structure of a radiator with which shorter assembling time can be obtained and greater heat dissipation capability can be reached.

2. Brief Description of the Related Art

Due to electronic industry being progressively developed with a trend of product design being lightness, thinness, shortness and smallness, heat generated by electronic parts such as microprocessor and chips are getting higher. It leads heat dissipation becomes a vital subject for maintaining product system running normally. Generally, cooling fins being attached to the electronic heat generation parts incorporated with a fan to remove the heat is a method of system heat dissipation in order to prevent the parts from being overheated and to prolong life span of the parts. The conventional radiators have parallel type shown in FIG. 1 and circular type shown in FIG. 2. The cooling fins in the radiator can be made by way of aluminum extruding, die casting or stacking.

The preceding three fabricating ways have been used in the parallel type radiator. Due to limit of capability of machining, the cooling fins fabricated with the aluminum extruding or the die casting is unable to be very thin such that the gross heat dissipation area per unit volume of the radiator is low. The cooling fins made with stacking can be thinner so that the gross heat dissipation area per unit volume of the radiator is high with greater heat dissipation capability.

Further, the cooling fins in the circular type radiator mostly are fabricated with aluminum extruding or die casting instead of stacking, which takes longer assembling time and higher cost.

Taiwanese Patent Official Gazette No. 196973, entitled "CIRCULAR RADIATOR WITH SECTOR COOLING FINS", granted to the present inventor, shown in FIG. 3 and a heat pipe type parallel stacked cooling fins shown in FIG. 4 disclose a heat straight pipe is inserted through a plurality of sector cooling fins and then is bent a circular shape to join a cooling base so as to form a circular radiator. The structure of the circular radiator can be adjusted with the radian of the sector cooling fin to accommodate with limited space and provides higher heat dissipation efficiency than the heat pipe with parallel stack type radiator.

SUMMARY OF THE INVENTION

The crux of the present invention is to improve the preceding circular radiator with sector cooling fins. Accordingly, the present invention is to provide a heat pipe type circular radiator, which includes a plurality of sector cooling fins and a heat pipe. Each of the sector cooling fins has a main fin member with a through hole and has a big sector folded side and a small sector folded side at two lateral sides of the main fin member, respectively. The characteristics of the present invention are listed in the following:

(1) A heat pipe is inserted through a plurality of sector shaped cooling fins. Each of the sector shaped cooling fins has a main body parallel to each other with a small sector folded side and the small sector folded side has a joining point C, which is arranged to corresponding to the center of the heat pipe.

(2) The big sector folded side is apart from the main body an angle and the angle can be adjusted based on a curvature of the circular radiator. Due to the angle, the big sector folded sides of the sector cooling fins do not interfere with each other while the sector cooling fins have been inserted with the heat pipe and before the heat pipe is bent.

(3) When the heat pipe with the sector shaped cooling fins is bent circularly, the joining points of the respective small sector folded side on each sector shaped cooling fin closely contacts with the joining points of another sector shaped cooling fin next to it.

(4) Originally, the angle between the big sector folded side and the main fin member and the angle between the small sector folded side and the main fin member are different magnitudes from each other. The angle between the main body and the small sector folded side on each sector cooling fin is kept unchanged and the angle the big sector folded side and the main fin member is changed while the big sector folded side is bent such that the two angles become equal and allow the big sector folded side and the small sector folded side lying on the same plane.

(5) Once the heat pipe with the sector cooling fins has been bent as a circular shape with the small and big sector folded sides, the cooling base can be joined to form the circular radiator.

(6) Alternatively, the heat pipe can be bent in advance before inserting through the sector cooling fins. As the foregoing, the joining points of the respective small sector folded side on each sector shaped cooling fin can closely contact with the joining points of another sector shaped cooling fin next to it. Then, the respective big folded side is bent to change the angle between the respective main body and the respective big folded side such that the small and big sector folded sides can lie on the same plane.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
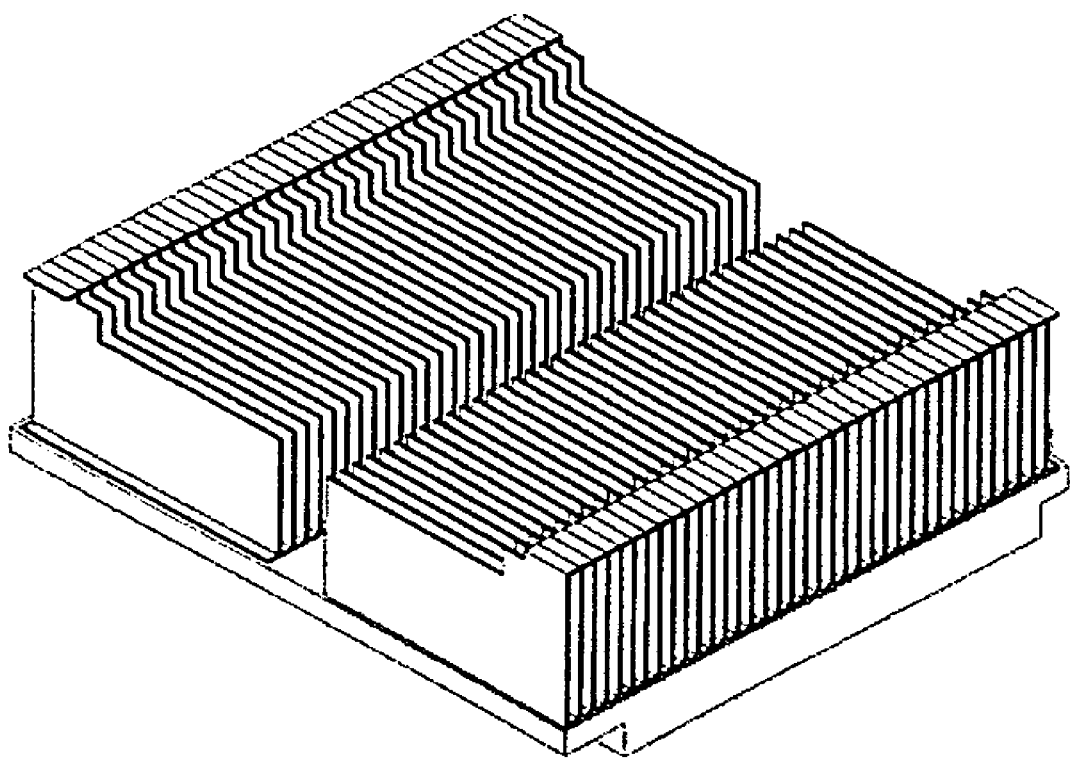
FIG. 1 is a perspective view of the conventional parallel type radiator.
Figure 2:
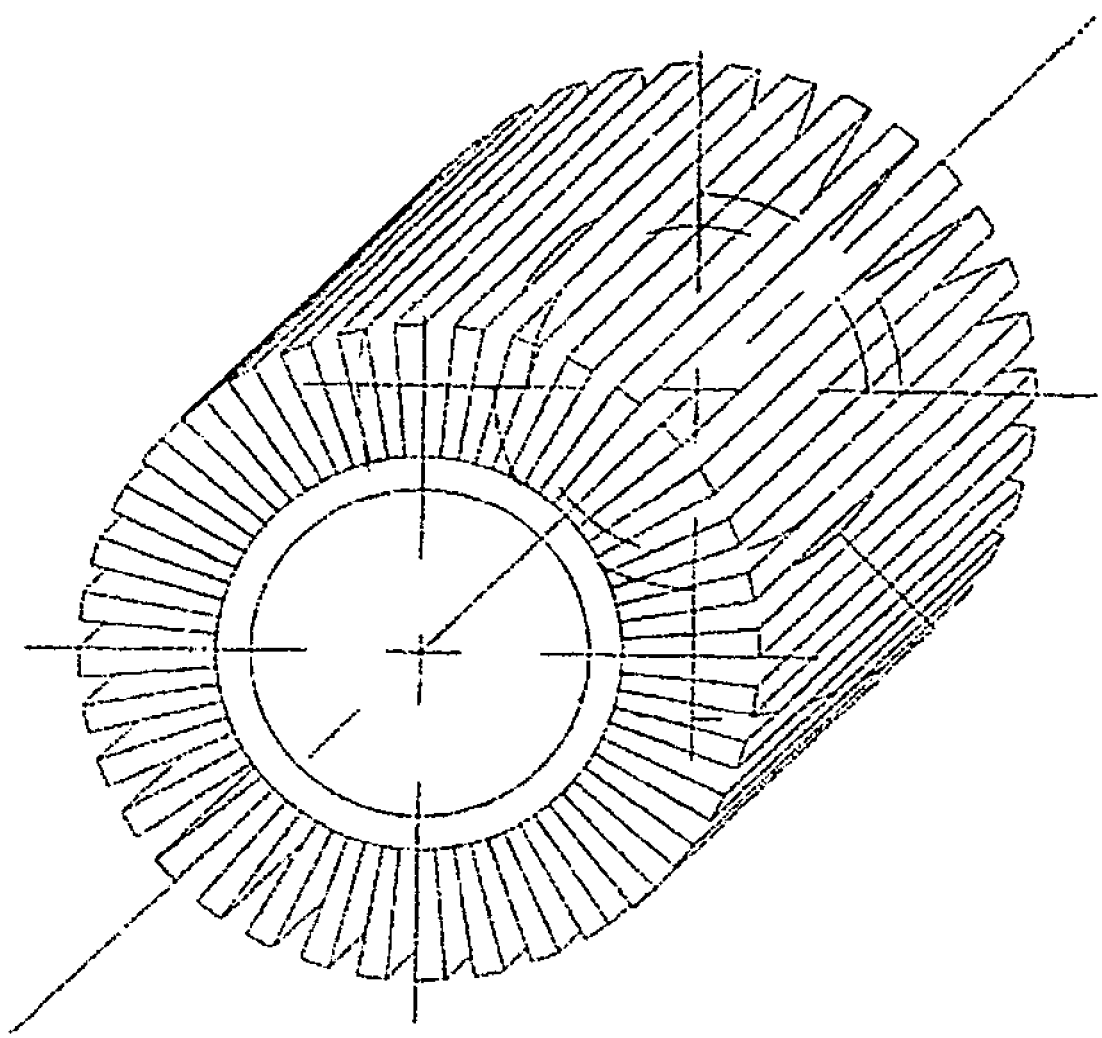
FIG. 2 is a perspective view of the conventional aluminum extruded circular radiator.
Figure 3:
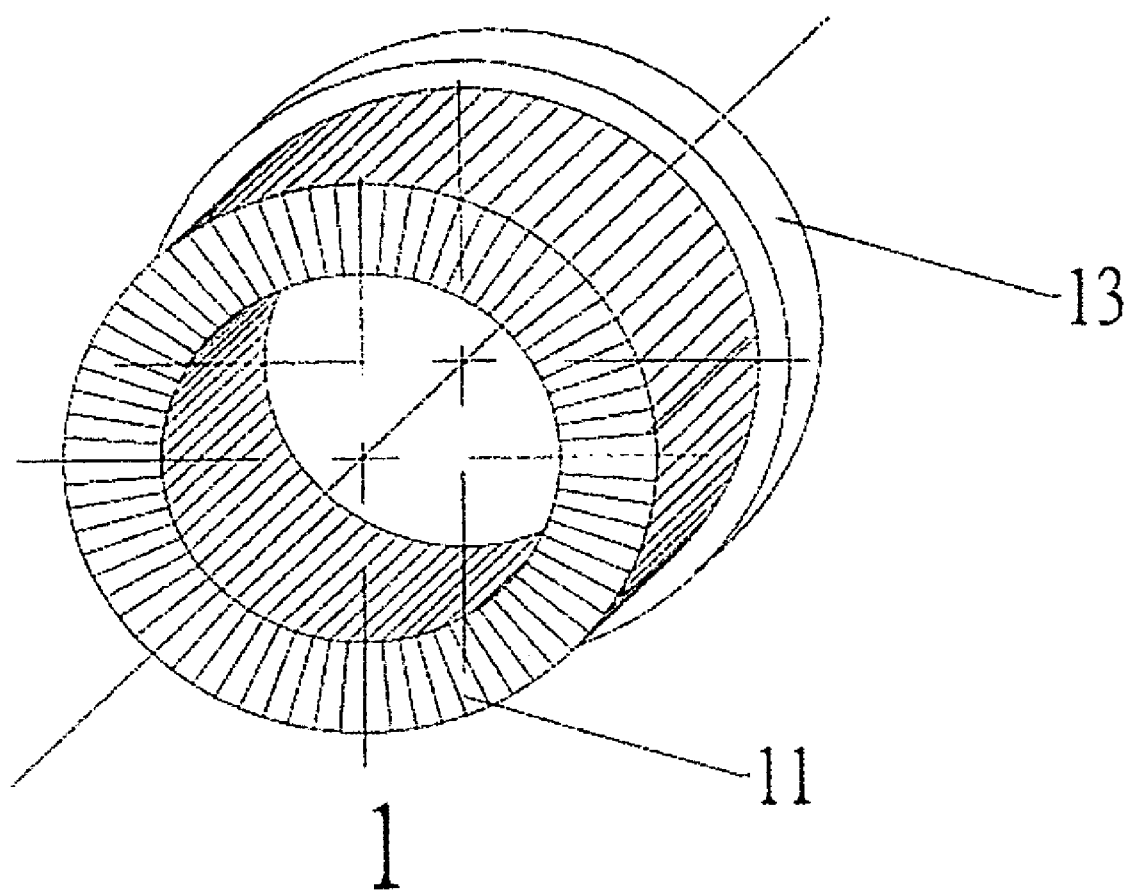
FIG. 3 is a perspective view of the conventional stack type circular radiator.
Figure 4:
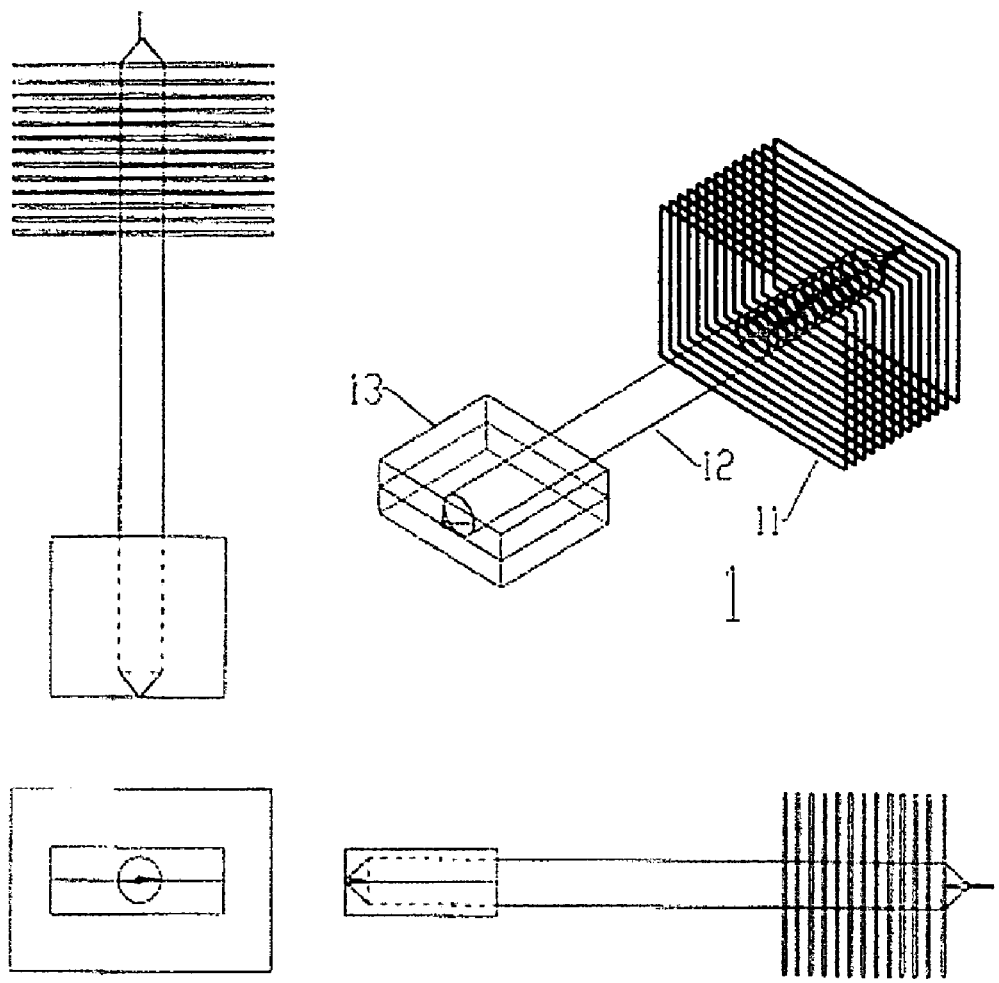
FIG. 4 is a perspective view of the conventional heat pipe type parallel stacked cooling fins.
Figure 5:
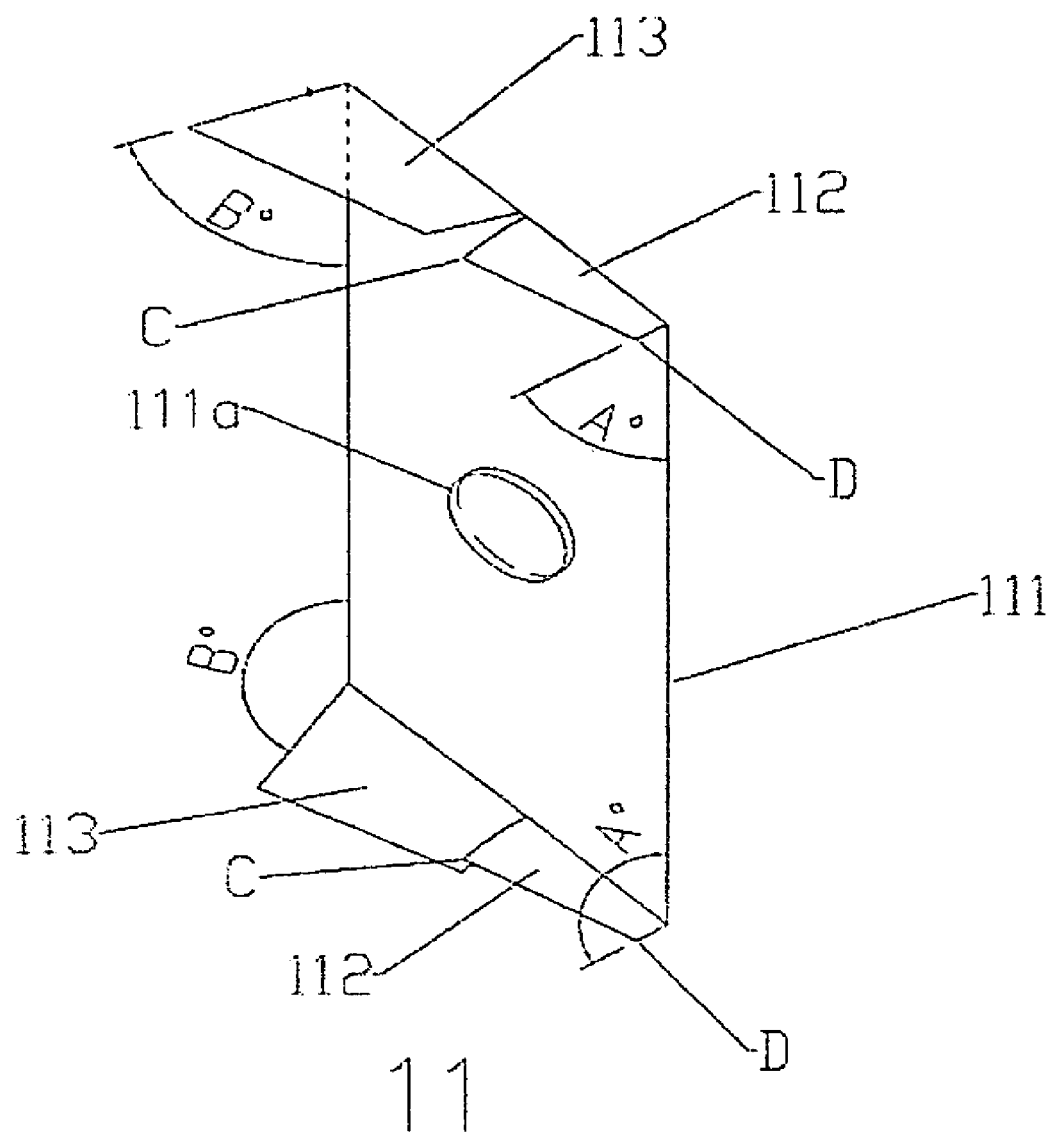
FIG. 5 is a perspective view of a sector shaped cooling fin according to the present invention.
Figure 6:
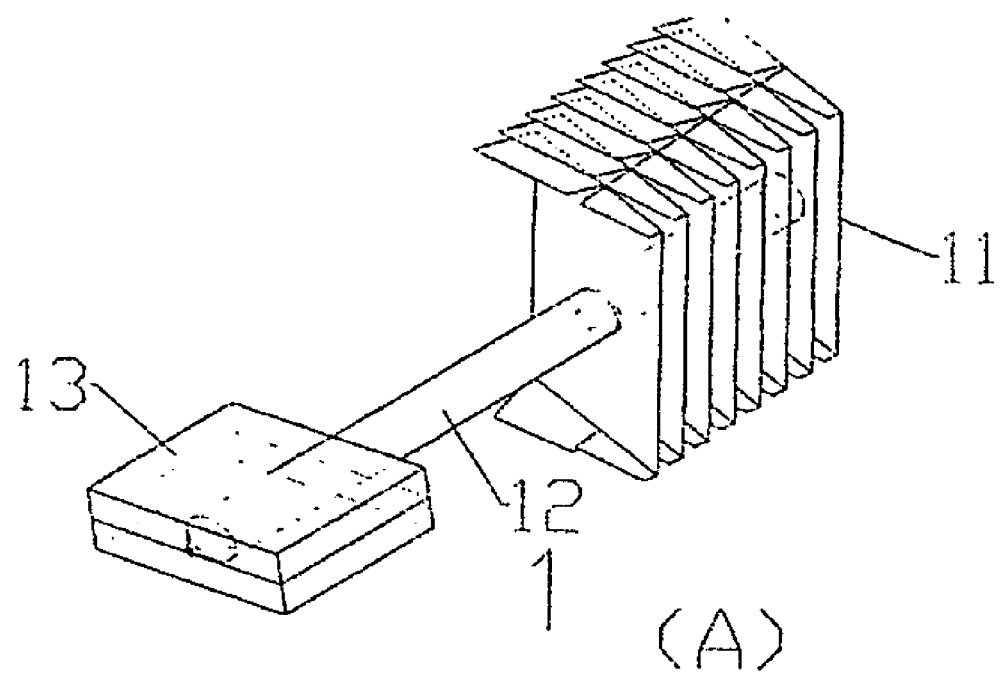
FIGS. 6A and 6B are perspective views of sector shaped cooling fins arranged in a heat pipe type circular radiator of the present invention.
Figure 6:
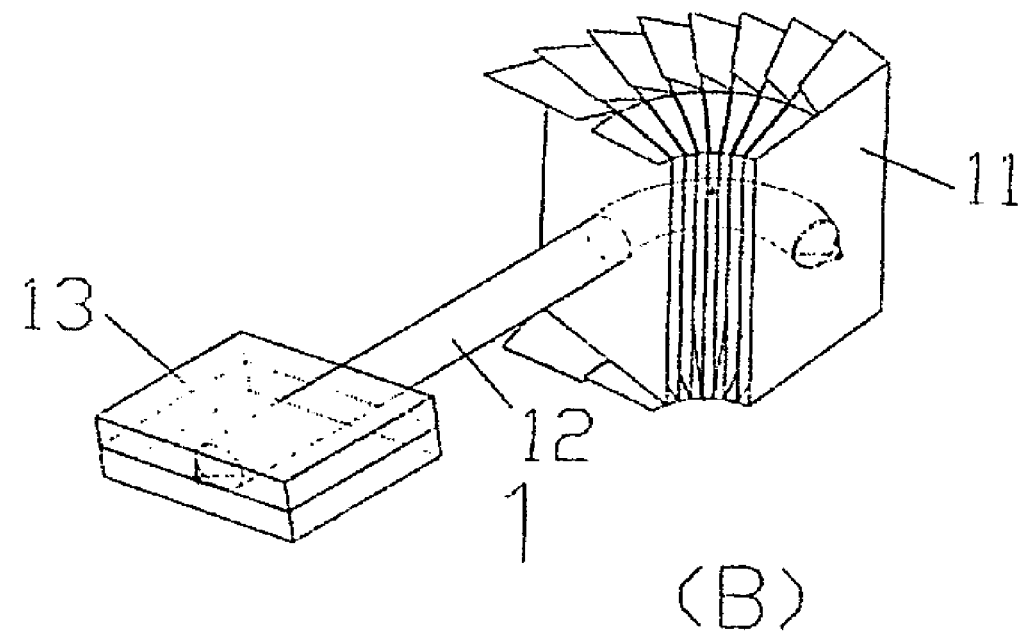
Figure 7:
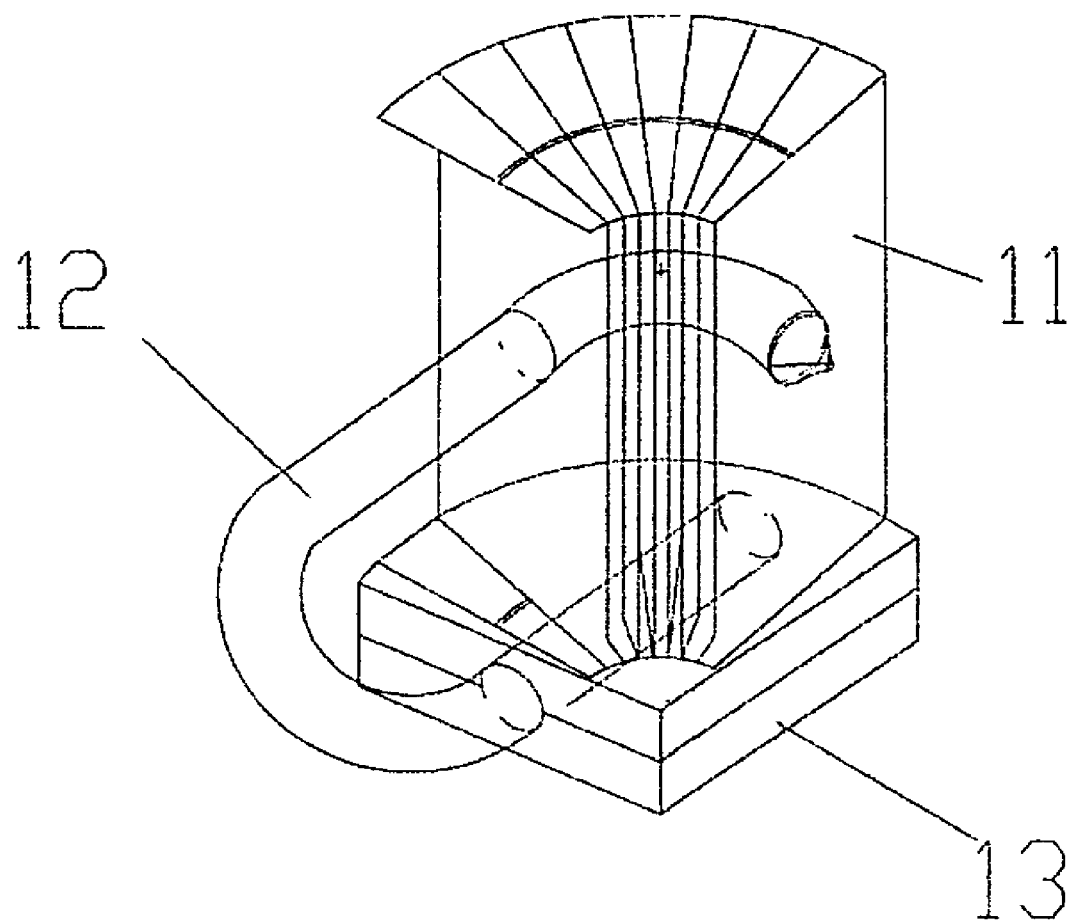
FIG. 7 is a perspective view of a heat pipe type circular radiator according to the present invention.

Referring to FIGS. 5 to 7, a heat pipe type circular radiator according to the present invention is composed of a plurality sector shaped cooling fins. The features of the present invention are listed in the following:

(1) It can be seen in FIG. 6A that a heat pipe 12 is inserted through a plurality of sector shaped cooling fins 11. Each of the sector shaped cooling fins 11 has a main fin member 111 respectively with a small sector folded side 112 and a big sector folded side 113 at two opposite lateral sides of the main body 111. The respective main fin member 111 is parallel to each other and the respective small sector folded side 112 has a joining point C, which is arranged to corresponding to the center of the heat pipe 12, and a joining point D as shown in FIG. 5.

(2) The respective big sector folded side 113 of is apart from the main fin member 111 an angle B and the angle B can be adjusted based on a curvature of the circular radiator. Due to the angle B, the big sector folded sides 113 of the sector cooling fins 11 do not interfere with each other while the sector cooling fins 1I have been inserted with the heat pipe and before the heat pipe 12 is bent. Further, the respective small sector folded side 112 is apart from the main fin member 111 an angle A.

(3) When the heat pipe 12 with the sector shaped cooling fins 11 is bent circularly as shown in FIG. 6B, the joining points C and D of the respective small sector folded side 112 on each sector shaped cooling fin 11 closely contacts with the joining points C and D of another sector shaped cooling fin 11 next to it as shown in FIG. 5.

(4) Originally, the angles B and A are different magnitudes from each other. The angle A between the main fin member 111 and the small sector folded side on each sector cooling fin 11 is kept unchanged and the angle B is changed while the big sector folded side 113 is bent such that the angle B can become equal to the angle A. In this way, the big sector folded side 113 and the small sector folded side 112 can lie on the same plane.

(5) Once the heat pipe 12 with the sector cooling fins 11 has been bent as a circular shape as shown in FIG. 6B with the small and big sector folded sides 112 and 113, the cooling base 13 can be joined to form the circular radiator as shown in FIG. 7.

(6) Alternatively, the heat pipe 12 can be bent in advance before inserting through the sector cooling fins 11. As the foregoing, the joining points C and D of the respective small sector folded side 112 on each sector shaped cooling fin 11 can closely contact with the joining points C and D of another sector shaped cooling fin 11 next to it as shown in FIG. 5. Then, the respective big folded side 113 is bent to change the angle B between the respective main fin member 111 and the respective big folded side 113 such that the small and big sector folded sides can lie on the same plane.

While the invention has been described with referencing to preferred embodiments thereof, it is to be understood that modifications or variations may be easily made without departing from the spirit of this invention, which is defined by the appended claims.

What is claimed is:

1. A heat pipe type circular radiation, comprising:
   a plurality of sector cooling fins, each of the sector cooling fins having a main fin member with a through hole, providing a big sector folded side and a small sector folded side at two lateral sides of the main fin member, respectively; and
   a heat pipe, passing through the through hole of respectively;
   characterized in that the small sector folded side of each of the sector cooling fins has two joining parts being arranged in a way of the two joining parts closely contact with next two joining parts when the heat pipe passes through the cooling fins; and an angle is formed between the big folded side and the main fin member and the angle changes with respect to a curvature of a bend formed by way of the heat pipe with the sector cooling fins being bent so that the big folded side of each of the sector cooling fins does not interfere with each other.

2. The heat pipe type circular radiation as defined in claim 1, wherein the heat pipe can be an optional pipe with any fluids as working medium.

3. The heat pipe type circular radiation as defined in claim 1, wherein the cross section the heat pipe can be any shapes with any conductive material.

4. The heat pipe type circular radiation as defined in claim 1, wherein the sector cooling fins are joined in parallel with each other before the heat pipe is inserted through the cooling fins.

5. The heat pipe type circular radiation as defined in claim 1, wherein the big folded side can be machined to bend with the same plane of the small folded side.

6. The heat pipe type circular radiation as defined in claim 1, wherein the heat pipe can join with the sector cooling fins by way of tight fit, adhering or welding.

* * * * *